United States Patent [19]

Baumgartner et al.

[11] 4,073,859
[45] Feb. 14, 1978

[54] TECHNIQUE FOR MAKING SILICON U-SHAPED MEMBERS

[75] Inventors: Werner Baumgartner, Munich; Manfred Schnöeller, Haimhausen, both of Germany

[73] Assignee: Siemens Aktiengesellschaft, Berlin & Munich, Germany

[21] Appl. No.: 637,520

[22] Filed: Dec. 4, 1975

[30] Foreign Application Priority Data

Feb. 10, 1975 Germany ............................ 2505540

[51] Int. Cl.² ............................................. B29C 17/02
[52] U.S. Cl. .................................... 264/322; 264/295; 264/323; 264/339; 425/392
[58] Field of Search ............... 264/339, 323, 295, 322, 264/295; 425/392, 445; 72/128

[56] References Cited

U.S. PATENT DOCUMENTS

| 2,571,416 | 10/1951 | Brown | 264/339 |
| 3,368,377 | 2/1968 | Hirayama | 72/128 |
| 3,776,539 | 12/1973 | Curtis et al. | 425/392 |
| 4,012,217 | 3/1977 | Reuschel | 65/108 |

FOREIGN PATENT DOCUMENTS 934,184   8/1963   United Kingdom ................. 264/339

Primary Examiner—Robert F. White
Assistant Examiner—John A. Parrish
Attorney, Agent, or Firm—Hill, Gross, Simpson, Van Santen, Steadman, Chiara & Simpson

[57] ABSTRACT

Method and apparatus for forming silicon U-shaped carrier members from straight silicon rods using a combination of rod movement, zone heating, and controlled bending.

9 Claims, 4 Drawing Figures

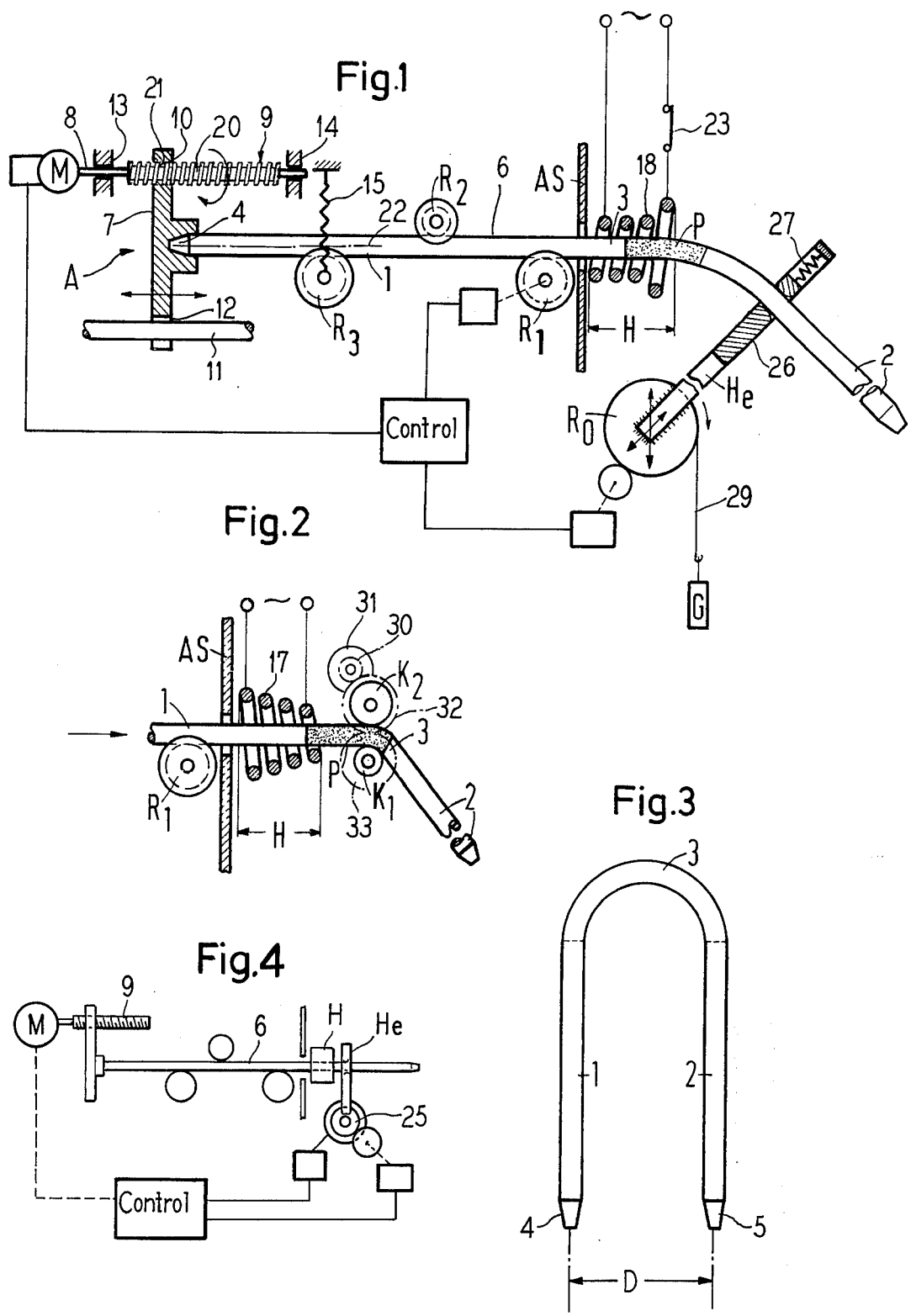

TECHNIQUE FOR MAKING SILICON U-SHAPED MEMBERS

BACKGROUND OF THE INVENTION

Silicon U-shaped carrier members are conventionally mounted upright in the interior of a reaction vessel, electrically heated, and subjected to silicon deposition over outer surfaces thereof. Though in the past such U-shaped carrier members have been commonly made of two spaced, parallel, equally sized straight rod sections interconnected by a third rod section mounted across the upper ends thereof, recently a general process has been discovered whereby a single straight starting rod of silicon can be bent directly in a U-shaped carrier member in such a manner that the product member is surprisingly uniformly electrically heatable. See co-pending application Ser. No. 629,916, now U.S. Pat. No. 4,012,217, filed on Nov. 7, 1975 herewith. However, the art still needs an optimized, mechanized, reliable, automatable technique suitable for bending initially straight silicon rods into desired U-shapes.

BRIEF SUMMARY OF THE INVENTION

The present invention is directed to an improved and particularly advantageous method and apparatus for the production of U-shaped silicon carrier members. The technique according to this invention is characterized in that a longitudinally moving plastic zone is formed in a supported, initially straight silicon rod, and the rod is systematically bent in controlled fashion into a desired U-shape by a rod supporting bending means which is applied to solid portions of the rod on one side of such plastic zone.

More specifically, in practicing the method of this invention, an initially straight silicon rod in a region thereof adjacent one boundary its mid section (or central section) is heated in a zone of heat to a temperature of plasticity while being supported or clamped on either longitudinal side of such heated region. The rod is then continuously advanced through the zone of heat while being bent at a constant rate of curvature by the clamping forces continuously. The process is continued until the rod curvature in the central section resembles a U-shape wherein the legs of the U are in spaced parallel relationship to one another.

The apparatus employed in practicing this invention comprises a combination of mechanical elements arranged and interrelated to one another, including, for a given silicon initially straight starting rod, horizontal translational movement and supporting means operating along the rod axis, a heating means applicable to a predetermined rod section, and a combined rod supporting and bending means, all as more particularly hereinafter described.

In accord with this invention, for making a U-shaped silicon carrier member having a spacing D between a pair of spaced, parallel legs, and having a central, curved interconnection therebetween whose length is $D\pi/2$ where $\pi$ equals 3.14+, a plastic zone in the central section is generated which extends through a starting silicon rod cross section and which extends lengthwise along the rod by a distance not greater than five times the rod diameter. This plastic zone is caused to move through the central section from one end thereof to the other by means of a heating zone. The section of the rod towards which the plastic zone relatively moves is supported mechanically by first means spaced from the plastic zone by a distance of from about 1 to 10 centimeters. The section of the rod away from which the plastic zone relatively moves is supported mechanically by second means located, at least at the beginning of a bending operation, generally at the boundary between the solid end piece or leg which is not being bent and the adjacent central section. The plastic zone is initiated adjacent this boundary in the region of the central section. This second means further also functions to bend the central section during a bending operation.

BRIEF DESCRIPTION OF DRAWINGS

In the Drawings:

FIG. 1 is a diagrammatic side elevational view of one embodiment of apparatus suitable for practicing the bending technique of the present invention, some parts thereof broken away and some parts thereof shown in section;

FIG. 2 is a view similar to FIG. 1 of an alternative embodiment of such apparatus but with elements thereof similar to those of the embodiment of FIG. 1 removed;

FIG. 3 is a plan view of a U-shaped carrier rod of the type produced by the bending technique of this invention; and FIG. 4 is a diagrammatic view of a further alternative embodiment of such apparatus.

DETAILED DESCRIPTION

The technique of this invention can be practiced in either one of two modes; for instance.

In one mode, the starting rod is fixedly mounted into a bending tool means serving both as a mounting and as a lever arm. Then, the position of such local mounting is successively pulled back from the heating zone at the same speed which the rod section preceding the heating zone is advanced (pushed) into the heating zone. While, however, the speed at which the rod is pushed into the heating zone is constant, the velocity vector at which the position of the local mounting is moved beyond the heating zone constantly changes its direction.

In the second mode, the center portion of a continuously advancing rod is guided through a deformation zone, directly after leaving the heating zone. This deformation zone is formed by the nip region between a pair of opposed calendar rolls, one roll having a larger diameter relative to the other thereof. As the rod passes therebetween under pressure, the rod center portion is bent with the intended extent of bending. The leg pieces of the rod, which are adjacent to the rod center portion on both sides, are not bent, as opposed to the center rod portion, and they remain straight. These leg pieces form the parallel legs of the U-shaped carrier member and on these legs the deposition of silicon is mainly effected subsequently from a corresponding reaction gas, during a later (conventional) application to the U-shaped carrier thereof. The bent center portion of a given U-shaped carrier member only has the task of providing a current-conductive connection between the two legs of a U-shaped carrier. If care is taken that the central portion of a given U-shaped carrier member has the same cross-section and essentially the same composition as the legs, then a more even temperature and more even silicon deposition conditions are characteristically obtained for the legs, than, for instance, in the case of a U-shaped carrier member comprised of a plurality of separate silicon pieces.

In the case of the first mode, the silicon rod which is to be bent is thus locally immovably mounted in a bending tool which functions as a lever arm at a mounting location provided after the heating zone. Then, after the activation of the heating zone during the production of a plastic zone in a rod, the mounting position is moved away from the heating zone by way of the angular movement of the bending tool about a fixed point of rotation, such angular movement being along a semicircle of radius positioned in a preferably vertical plane containing the entire axis of the silicon rod which is to be bent. The silicon rod is pushed into the heating zone preferably synchronously with such angular movement at a selected speed. Such a speed, and the heat capacity in the heating zone, are regulated relative to one another in such a way that preferably the length of the plastic zone in the rod being bent remains substantially constant.

In the case of the second mode, however, the silicon rod which is to be bent is mounted at a mounting position initially provided behind the heating zone between the two rotary, opposed bending rollers with their parallel rotary axes. These rollers are applied to the silicon rod at such a pressure that preferably non-axial shifting of the rod is possible both at the plastic and at the nonplastic positions. The heated plastic silicon material experiences an angular deformation due to the differential forces extended by the respective smaller and larger rollers upon the silicon rod.

Those apparatus portions which are maintained directly in contact with a heated silicon rod being bent, in particular such components as the bending tool and its mountings, are made of heat-resistant material. Generally, such material also has a high chemical inertness as respects any reaction with the silicon of the rod which is being bent. Suitable such materials include aluminum oxide, silicon carbide, boron carbide, silicon nitride, silicon dioxide (in particular quartz), magnesium oxide, berylium oxide, and other similar heat-resistant non-doped oxides. In one mode, it is preferred that these apparatus portions be made of a heat-resistant metal which is coated, in a prior art matter, using a reaction gas on the working surfaces with one of the above-mentioned inert and temperature-resistant compounds, such as especially $Al_2O_3$ or $MgO$.

Referring to FIG. 3, it is seen that a U-shaped carrier member produced according to the teachings of this invention has two spaced parallel straight legs 1 and 2 which are interconnected by a semi-circularly bent center portion or section 3. The distance between the respective centers of the two legs 1 and 2 is D, which is about equal to the distance between the electrodes which will later hold such carrier member during its treatment in a deposition device. Characteristically, a U-shaped carrier member produced by the teachings of this invention has a cross-sectional area which does not noticeably change longitudinally along such carrier because the so-called neutral fiber or neutral zone of the starting initially straight silicon rod is neither elongated nor contracted during bending.

Referring to FIGS. 1 and 2, individual characteristic features of apparatus embodiments of the present invention adapted for bending a preferably initially stretched silicon starting rod are seen. The center portion 3 of a rod being bent has length which is equal to $D\pi/2$ and the two end pieces or legs 1 and 2 preferably have equal lengths which, preferably, are each substantially larger than the length of the center portion 3. The respective free ends 4 and 5 of the legs 1 and 2 may be conically tapered in a preliminary operation in order to adapt such for convenient mounting in the electrodes (not shown) of a deposition apparatus. It is preferred that the length and the position of the center portion 3 be indicated or marked on a starting rod in a preliminary operation as a matter of convenience and accuracy.

A starting straight silicon rod is mounted horizontally in either one of the two bending apparatuses shown in FIGS. 1 and 2, respectively. Each such apparatus has a rod feed assembly which can be constructed as shown, for example, in FIG. 1. Thus, a rod feed assembly can comprise an electric motor M, a means A for converting rotational motion (here provided by the drive shaft 8 of motor M) into linear translation motion, and a support bracket 7 which here both engages a starting silicon rod 6 by mounting over end 4 of leg 1 thereof and interconnects with such converting means A. In the embodiment shown, such converting means A includes an elongated spindle 9 coaxially mounted to shaft 8. Bearings 13 and 14 support and journal spindle 9. Spindle 9 has a helical groove 20 cut in circumferential surfaces thereof. An aperture 10 defined adjacent an edge of bracket 7 permits bracket 7 to slidably move axially along and over circumferential surfaces of spindle 9. A spur 21 radially inwardly projecting into aperture 10 from an edge thereof engages such helical groove. Bracket 7 is spatially stabilized by a stationary guide shaft 11 which slidably extends through an aperture 12 defined in bracket 7. Thus, as shaft 8 rotates when motor M operates, the rod 6 is linearly translated along the axis 22 thereof by camming action between the helical groove 20 and the spur 21.

Rotatably mounted guide rollers $R_1$, $R_2$, and $R_3$ are spatially located with their respective mid-circumferential portions being in a common plane and with axis 22 extending therebetween as shown in FIG. 1. Leg 1 is yieldingly tensioned by rollers $R_1$, $R_2$, and $R_3$ by spring biasing means such as here illustrated by spring 15. A starting rod 6 thus is mounted initially so that the rod 6 horzontally extends through and is supported by rollers $R_1$, $R_2$ and $R_3$ through a heating zone H which can be a helical coil of electrically heated platinum wire, or the like. The support (here roller $R_1$) which is closest to the heating zone H in in accordance with the teachings of this invention, is positioned at a distance of at least about 1 cm and, at most, about 10 cm before the heating zone H. This spacing avoids substantially any bending of a rod 6 before the heating zone H is reached, since a steady temperature increase occurs along the rod forwardly of zone H to roller $R_1$ due to heat conduction from the heating zone H, which is above about 1180° C. A gradual lowering or downward bending of the section of rod 6 between roller $R_1$ and the heating zone H is possible with a spacing greater than about 10 cm due to the effect of gravity during the bending procedure caused by the last support (here roller $R_1$) being too far removed from the heating zone H.

This spacing also avoids another possible problem. During the course of a bending procedure, the plastic zone P associated with a rod 6 in the heating zone H can tend to shift (lengthen) towards roller $R_1$ with time passage during the course of a bending operation which is undesirable in the interest of obtaining a substantially uniform bending and curvature in the center region of a U-shaped carrier member being produced.

The two other guide rollers $R_2$ and $R_3$, respectively, are positioned at greater respective distances from the heating zone H than is the support roller $R_1$. The guide roller $R_3$, which is most remote from the heating zone H, also functions as a support roller. While rollers $R_1$ and $R_2$ may be rigidly mounted on their respective axes, roller $R_3$ is here mounted with yielding bias against the rod 6 (as indicated above) to aid in providing an exact guidance for the rod 6. The intermediate guide roller $R_2$ effectively presses the rod 6 against the two rollers $R_1$ and $R_3$.

It is preferred in one mode to operate the heating zone H so as to produce a plastic zone P which so extends from zone H along the rod 6 that the bending tool holding the rod forwardly of the heating zone H does not have to be applied in the vicinity of the heating zone H, as initially illustrated in the embodiment of FIG. 2. Components of this embodiment which are similar to those in FIG. 1 have been deleted. In FIG. 2, a conical induction heating coil 17 provides heating zone 11. The cross sectional diameter decreases (in the direction of travel of the rod). Since a bending rod 6 could contact the last windings of such an induction heating coil 17, the heating coil 18 of the embodiment shown in FIG. 1 has an opposite conical taper from that employed in the embodiment of FIG. 2. Sunnel-type tip ring induction-heating coils are preferably used in each of the embodiments shown in FIGS. 1 and 2, and each such coil is supplied with electric energy in the form of high-frequency waves.

The production of the plastic zone P, however, can also be effected in another manner, for instance, by way of applying radiant heat, for instance, through laser beams.

The bending tool in the case of the embodiment shown in FIG. 1 comprises a combination of a lever arm He, together with a coaxial pulley Ro. Puller Ro is rigidly coaxially connected with the lever arm He at its pivot point. The axis of rotation is spatially located so as to be generally normal with the axis of the silicon rod. The drive urging rotation of puller Ro about its axis of rotation is provided by a weight G which tangentially extends from the circumferential edge of pulley Ro by a strand or cord 29. Weight G is chosen so that the moment of rotation exerted through pulley Ro on arm He moves the rod 6, forwardly of heating zone H, linearly through an arcuate path with generally at same speed at which the leg portion of rod 6 before the heating zone H is moved.

The bending tool in the case of the embodiment shown in FIG. 1 comprises a combination of a lever arm He, together with a pulley Ro. Pulley Ro is rigidly coaxially connected with the lever arm He at its pivot point. The axis of rotation is spatially located so as to be generally normal with the axis of the silicon rod. The drive urging rotation of pulley Ro about its axis of rotation is provided by a weight G which tangentially extends from the circumferential edge of pulley Ro by a strand. Weight G is chosen so that the moment of rotation is exerted on the lever arm He of the bending tool therewith moves the mounting position of the rod 6, provided behind the heating zone H, linearly through an arcuate path with generally the same speed at which the leg portion before the heating zone H is pushed into the latter.

Alternatively the drive for the lever arm He can also be provided by a motor 25 as shown in FIG. 4 in such a way that the linear speed of the clamping device for the silicon rod 6 as in the lever arm He coincides with the axial transport speed of the rod 6 before the heating zone H. It is preferred to use lineal rod translational speeds of the order of a few mm, for instance about 2mm, per second.

The maintenance of a plastic zone P does not offer substantially more difficulties, for example, than are experienced, for example, in the maintenance of a melting zone in the case of a crucible-free zone melting of a silicon rod. There are no insurmountable difficulties in fully automatically synchronizing the drive speed at which the portion of rod 6 before the heating zone H is moved into the heating zone H with the rod departure speed away from zone H with the help of, for example, the lever arm He.

The motor M (see FIG. 1) can, for instance, be a stepping motor, and its rotational speed can be controlled and varied. For this purpose, only the difference between the linear speeds of the two rod leg portions 1 and 2 is determined, and this difference is converted into an electric analog voltage. The stepping motor M is regulated to a zero value by this difference voltage.

In practicing the method of this invention, the instantaneous effect of the bending moment exerted upon a length of the plastic zone P is controlled. In order to minimize such interferences, for instance, as the weight of a plastic zone P, as small as possible, the axial length of such plastic zone P is preferably not larger than about five times the diameter of a given rod. On the other hand, however, this axial length is preferably not smaller than about half the diameter of this rod. This length has a preferred value when it falls in the range from a value equal to the rod diameter up to a distance of about 1.5 times the rod diameter. It is obvious that any melting of the rod must be avoided during a bending operation.

After the rod has been mounted in a horizontal position in such a way that the boundaries between the push and the pull of the rod, in the direction of rod movement occur in the heating zone H and in the rod center portion 3 is directly behind the coil. Mounting involves positioning a rod in the clamping portion of the bending tool at the initial position provided. Then, the heating H is activated. As soon as a plastic zone P has formed, the bending tool starts to operate preferably automatically as can be indicated for example by a lowering in the end of the rod forwardly of the heating zone. At the same time, the rod 6 leg portion 1 positioned before the heating zone H is slowly now advanced continuously into the heating zone H preferably by means of a speed regulating means. The bending process is stopped as soon as the unbent leg portion 2 of the rod is directioned substantially parallel to the rod leg 1 still positioned before the heating zone. The end of pivotal movement of the lever arm He, or the mounted position of the rod in the lever arm He, respectively, describes a semicircular path during the bending process. Since the lever arm He can be embodied in such a way that the spacing between the position of the rod held by it and the pivot axis thereof is the equivalent to distance D, the two leg portions 1 and 2, which are now parallelly oriented, will now be spaced from one another by distance D, as is desired. The spaced parallel orientation of the legs 1 and 2 may, for instance, be indicated by a stop means (not shown). The latter may then be incorporated into the embodiment of either FIG. 1 or FIG. 2 in such a way that, when the rod bending is completed, an electric switch contact opens the switches energizing the heating zone H and rod translation.

In the case of the embodiment shown in FIG. 2, only the bending tool may be regarded as different than that of the embodiment shown in FIG. 1. The bending tool in the embodiment of FIG. 2 consists of two rollers $K_1$ and $K_2$, respectively, which are each rotatably mounted on an axis which is in spaced parallel relationship to the other thereof. Preferably, the rollers $K_1$ and $K_2$ are arranged vertically with respect to one another, so that the horizontally mounted rod is extendable therebetween. The compressive pressure of the two rollers $K_1$ and $K_2$ onto the rod 6 therebetween is such that these rollers do not prohibit the axial movement of the rod. However, the rollers $K_1$ and $K_2$ do exert a noticeable deformation pressure on the rod 6 in the plastic zone P thereof. The two rollers $K_1$ and $K_2$ are advantageously equipped with a drive means. For example, a motor 30 can be used to rotate a drive gear 31 which engages a driven gear 32 coaxially regidly mounted with roller $K_2$. Gear 32 can then drive a second similar driven gear 33 so that rollers $K_1$ and $K_2$ rotate each at the same number of revolutions per unit of time. Motor 30 can be synchronized with the rod drive located before the heating zone H. Since, the two rollers $K_1$ and $K_2$ have different diameters, with roller $K_2$ having a larger diameter than $K_1$, a resulting differential deformation of the plastic zone P results, due to the effect of the pressure of the two respective rollers $K_1$ and $K_2$, so that the rod portion leaving the region of the two rollers $K_1$ and $K_2$ has been bent concavely on the side of the roller $K_1$ having the smaller diameter, but is bent convexly on the side of the roller $K_2$ having the larger diameter, with an equal bending radius. The extent of the bending of any given rod depends on the temperature of the plastic zone P, the diameters of the two rollers $K_1$ and $K_2$, the translational speed and the like. The roller $K_1$ having the smaller diameter is, advantageously arranged below the other roller $K_2$. The rollers may optionally be heatable by way of a hot stream of inert as directed against them from a source not shown.

The bending devices shown in FIGS. 1 and 2 are advantageously positioned within a protective (inert) gas, at least the respective parts thereof relating to the heating zone and to the bending device. The same is true for plastic regions of a rod 6.

In summary, the apparatus of this invention includes roller means which both supports such a rod in a generally straight, horizontal attitude and guides translational movement of such rod along the axis thereof relative to such roller means.

The apparatus also employs heating means for warming to plasticity an entire cross-sectional region of said rod. Such plasticity region has an axial length relative to such rod of from about ½ to 5 times the average transverse thickness of said rod. This heating means includes temperature regulating means which can be conventional in construction for maintaining the temperature of said heating means within a predetermined range. This heating means is located in generally fixed but adjacent relationship to the roller means but is spaced at a distance therefrom such that the adjacent edge of said heating means is spaced from the adjacent portion of said roller means by from about 1 to 10 centimeters.

The apparatus further employs a first drive means functionally associatable with first portions of such rod which are supported by such roller means (and which portions become a leg of a product U-shaped member).

This first drive means effects horizontal axial translational movement of such rod in one direction relative to said roller means into said heating means. For such first drive means a first power head such as a motor or the like is provided.

The apparatus still further employs a bending assembly. This bending assembly includes means for clamping such rod, such as a pair of spring biased jaws 26 and 27 in the FIG. 1 embodiment. This bending assembly is functionally located in generally fixed but adjacent relationship to such heating means with the clamping means initially generally horizontally alignable with such roller means the initial (straight) axes of such rod. This bending assembly is thus adapted to support said rod initially in a generally straight, horizontal attitude, and continues to support such rod during a bending operation.

This bending assembly further includes both bending means and second drive means. The bending means is functionally associated with such clamping means and is adapted to bend downwardly at a predetermined constant angle portions of such rod in the plasticity region thereof. The second drive means is functionally associatable with such clamping means and is adapted to move such clamping means to effect an angular axial translational movement of such rod away from the heating means in substantially the same plane as that occupied by the axis of said rod in said first portions thereof. This second drive means includes a second power head therefor.

The first drive means being adapted to produce an axial linear translational speed which is approximately the same as the axial angular translational speed produced by second drive means.

The apparatus of this invention includes first switch means (not shown) for actuating and deactuating said first drive means and said second drive means, which can be of any desired form and may involve more than a single switch element, as those skilled in the art will appreciate. Also, this apparatus further includes second switch means independent of such first switch means for actuating and deactuating said heating means, such as a switch 23 in the FIG. 1 embodiment.

The interrelationship between the respective such heating means, such first drive means, and such second drive means is such that, during normal predetermined operation of such apparatus, a predetermined central section of such rod is bendable into a desired semi-circular configuration which can be considered to have a diameter D and which has a substantially constant predetermined angle of curvature per unit of axial rod length, thereby to produce a desired U-shaped member.

In one mode as illustrated in FIG. 1, the bending assembly incorporates a lever arm assembly which includes means pivotally mounting such arm at one end thereof. The clamp means is associated with an opposed end region of such lever arm. The second drive means is here adapted to move such lever arm about the pivotal mounting means thereof. The pivotal mounting means has an axis located substantially at the center of the desired semi-circular configuration (for the U-shaped member). The second drive means in this mode can comprise a pulley 28 which is coaxially mounted on the same axis as that of the lever arm He. A weight G is circumferentially suspended from such pulley 28 by a cord 29 which is wound on pulley 28. Thus, the second drive means continuously exerts about the same moment of rotation upon the lever arm He during operation thereof independently of the pivot position of lever arm He.

In another mode, the second drive means incorporates two rollers $K_1$ and $K_2$ which have their respective axes in vertically spaced, parallel relationship to each other and which have their respective axes extending transversely with respect to the rod axis. The upper one of such rollers $K_2$ has a larger diameter than the lower roller $K_1$. The rollers $K_1$ and $K_2$ are adapted to engage in a suitable nip region therebetween the rod in a clamping configuration, thereby to provide the desired rod clamping means.

In this second mode, the second drive means is adapted to rotatably drive each of the rollers $K_1$ and $K_2$ at substantially a same rate of revolution about their respective axes. The spatial location of the rollers $K_1$ and $K_2$ is such that the rod is supported thereby initially in a straight condition. The relationship between the heating means and the bending assembly is such that the plasticity region extends forwardly therefrom in the direction of movement of the rod so as to lie between the rollers $K_1$ and $K_2$ during operation of said apparatus.

Preferably, apparatus of this invention is equipped with control and regulator means whereby the respective first and second drive means are operated synchronously. This can be accomplished in various ways. In one way, the first drive means is equipped with linear axial translational speed regulating means maintaining the axial translational rod speed of said first rod portions within a predetermined range. Regulator means is functionally associated with the second drive means and is adapted to vary the speed of the angular axial translational rod movement over a predetermined range in response to an input signal fed thereto. Signal generating means is provided which is adapted to generate a first signal representative of the instantaneous axial translational speed of the first drive means. Sensing means is provided which is adapted to generate a second signal representative of the instantaneous angular axial translational speed of said rod. Controller means is further provided which functionally interconnects such sensing means, such regulator means, and such signal generating means. This controller means is adapted to receive and compare such second signal with such first signal, and is further adapted to generate an output signal representative of any difference between such first signal and such second signal, and to feed such output signal to such regulator means whereby such angular axial translational movement is maintained substantially the same as such linear axial translational speed.

In another control way, the second drive means is provided with angular axial translational rod speed regulating means for maintaining angular axial translational speed of second rod portions of said rod which located are beyond such heating means within a predetermined range. Regulator means is functionally associated with the first drive means and is adapted to vary the speed of the linear axial translational rod movement over a predetermined range in response to an input signal fed thereto. Signal generating means is provided which is adapted to generate a first signal representative of the instantaneous angular axial translational rod speed of said second drive means. Sensing means adapted to generate a second signal representative of the instantaneous linear axial translational speed of the rod. Controller means is further provided which functionally interconnects such sensing means, such regulator means, and such signal generating means. This controller means is adapted to receive and compare such second signal with such first signal, and is further adapted to generate an output signal representative of any difference between such first signal and such second signal and to feed said output signal to said regulator means whereby such linear axial translational movement is maintained substantially the same as such angular axial translational speed.

The method of this invention involves bending an initially substantially straight, uniform silicon starting rod into a U-shaped member. This U-shaped member is characterized by having an axis and a pair of spaced, parallel leg members interconnected together across a pair of adjacent end portions thereof by an integral, hemicircular curved central section having a substantially constant predetermined angle of curvature. This method utilizes as a first step exposing a region in horizontally extending such starting silicon rod to a heating zone which warms such region to its softening temperature. Such region has an axial length of from about ½ to 5 times the average transverse thickness of said rod, typical average rod thicknesses falling in the range from about 3 to 50 mm. Such softened region is located generally adjacent one edge of the predetermined mid-section of such a rod. Simultaneously with such heating, the rod is supported on each side thereof to support the softened region which results.

Then, with the heating zone still functioning, the following things simultaneously occur: First, the rod is pushed from a portion of the leg thereof which is remote to that leg thereof which is adjacent to such softened region into and through such heating zone at a constant rate of speed whereby such softened region progresses or moves along said mid section with concurrent cooling to a point of rigidity occurring on either longitudinal side of such softened region.

Secondly, such rod is bent downwardly at a portion of such adjacent leg thereof. This bending occurs only in such softened region, and such bending is only at a predetermined constant angle.

Thirdly, such rod is pulled from or at a portion of such adjacent leg thereof through and from such heating zone. The rate of such pulling is substantially equal to the rate of such pushing.

Such pushing, such bending, and such pulling, are conducted (a) with the axis of such rod being maintained in a substantially planar configuration; (b) until such mid section is formed into a hemicircular configuration having a substantially constant predetermined angle of curvature, and (c) while maintaining such rod at a substantially constant length.

Finally, when such mid-section has assumed a semicircular configuration, simultaneously such heating zone is removed from such rod, such pushing is ceased, such bending is ceased, and such pulling is ceased. Also, simultaneously and thereafter, such rod is supported until said softened region therein solidifies.

Preferably, in such method, the distance along such rod between the edge of the supporting zone on said remote leg and the adjacent edge of said heating zone ranges from about 1 to 10 centimeters. Preferably also, in such method, such bending and such pulling are accomplished by a single bending tool.

In one more preferred mode, in such method, such bending and such pulling are accomplished with a lever arm having a free pivotable end clamped to said silicon rod and having a fixed end which is turning about an axis at a controlled rate. Preferably, the pivotable lever arm moves at a constant angular velocity. In a second more preferred mode, in such method, such bending and such pulling are accomplished with two driven rollers whose respective axes are in vertical relationship to one another. The upper roller has a larger diameter than the lower roller and the rollers are adapted to grip transversely therebetween such rod. The relationship between such softened region and such rollers is such that such softened region extends therebetween, and such rollers coact to accomplish such bending and such pulling in such softened region. Preferably such softened region extends beyond said heating zone in the direction of movement of said rod.

In the use of such apparatus and method, typical transport speeds for such rod range from about 3 to 50 mm/min. A preferred transport speed is about 18 mm/min. Another preferred transport speed is about 2 mm/min.

We claim:

1. A method for bending an initially substantially straight, uniform silicon starting rod into a U-shaped member such that the product member is uniformly electrically heatable thereafter having an axis and a pair of spaced, parallel leg members interconnected together across a pair of adjacent end portions thereof by an integral, hemicircular curved section having a substantially constant predetermined angle of curvature, said method comprising the steps of A. exposing a region in horizontally extending such starting silicon rod to a heating zone which warms said region to its softening temperature, said region having an axial length of from about ½ to 5 times the average transverse thickness of said rod, said softened region being located generally adjacent one edge of the predetermined mid-section of said rod, said rod being simultaneously supported on each side of said softened region, then B. simultaneously
   1. pushing said rod from a portion of the leg thereof which is remote to that leg thereof which is adjacent said softened region through said heating zone at a constant rate whereby said softened region progresses along said mid section with concurrent cooling to point of rigidity occurring on either longitudinal side of said softened region,
   2. bending downwardly said rod at a portion of said adjacent leg thereof, the bending occurring in said softened region and the bending being at a predetermined constant angle,
   3. pulling said rod from a portion of said adjacent leg thereof from said heating zone, the rate of said pulling being substantially equal to the rate of said pushing, said pushing, said bending, and said pulling, being conducted
   a. with the axis of said rod being maintained in a substantially planar configuration,
   b. until said mid section is formed into a hemicircular configuration having a substantially constant predetermined angle of curvature, and
   c. while maintaining said rod at a substantially constant length, and then C. simultaneously removing said heating zone from said rod, ceasing said pushing, said bending and said pulling, and supporting said rod until said softened region solidifies.

2. The method of claim 1 wherein the distance along said rod between the edge of the supporting zone on said remote leg and the adjacent edge of said softened region ranges from about 1 to 10 centimeters.

3. The method of claim 1 wherein said bending and said pulling are accomplished by a single bending tool.

4. The method of claim 3 wherein said bending and said pulling are accomplished with a lever arm having a free end clamped to said silicon rod and having a fixed end which pivots about an axis at a controlled rate.

5. The method of claim 4 wherein said pivotable lever arm pivotably moves at a substantially constant angular velocity.

6. The method of claim 1 wherein said softened region extends beyond said heating zone in the direction of movement of said rod.

7. The method of claim 1 wherein, in step B, said pushing rate of said rod ranges from about 3 to 50 mm/min.

8. The method of claim 7 wherein said pushing rate is about 18 mm/min.

9. The method of claim 7 wherein said pushing rate is about 2 mm/min.

* * * * *